US012625109B2

(12) United States Patent (10) Patent No.: US 12,625,109 B2
Zhang (45) Date of Patent: May 12, 2026

(54) DETECTION STRUCTURE FOR CHIP EDGE CRACKS AND DETECTION METHOD THEREOF

(71) Applicant: MONTAGE TECHNOLOGY CO., LTD., Shanghai (CN)

(72) Inventor: Xiong Zhang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 520 days.

(21) Appl. No.: 18/079,149

(22) Filed: Dec. 12, 2022

(65) Prior Publication Data

US 2023/0184718 A1 Jun. 15, 2023

(30) Foreign Application Priority Data

Dec. 10, 2021 (CN) .......................... 202111509808.9

(51) Int. Cl.
*G01N 27/90* (2021.01)
*H10P 72/00* (2026.01)
(52) U.S. Cl.
CPC ..... *G01N 27/9006* (2013.01); *H10P 72/0616* (2026.01)
(58) Field of Classification Search
CPC ....... H01L 22/34; H01L 23/585; H01L 22/32; H01L 23/562; G01R 31/2884; G03R 31/2896
See application file for complete search history.

(56) References Cited

U.S. PATENT DOCUMENTS 6,833,720 B1 * 12/2004 Daubenspeck ....... H01L 23/564
324/750.16
7,061,263 B1 * 6/2006 Ong ................... G01R 31/2884
324/754.03

2012/0104594 A1 * 5/2012 Chen ........................ H01L 24/13
257/737
2019/0107575 A1 * 4/2019 Pagani ............... G01R 31/2884
2021/0356514 A1 * 11/2021 Polomoff ........... G01R 31/2853

FOREIGN PATENT DOCUMENTS

CN 102790040 A 11/2012
CN 110034071 A 7/2019

OTHER PUBLICATIONS

Nov. 26, 2025 Office Action issued in Chinese Patent Application No. 202111509808.9.

* cited by examiner

*Primary Examiner* — Alia Sabur
(74) *Attorney, Agent, or Firm* — Oliff PLC

(57) ABSTRACT

The present application discloses a detection structure for chip edge cracks and a detection method thereof. In one embodiment, the detection structure comprises a test ring located between a chip scribe line and a sealing ring, wherein the chip internally comprises two test pads for detecting continuity of the test ring, the sealing ring comprises a P-type doped ring located in a substrate and a shallow trench isolation area for isolating the sealing ring the test ring, the shallow trench isolation area is formed with N-type doped regions electrically connected to the two test pads respectively; the test ring comprises a multi-layer interconnection structure located on the substrate and the interconnection structure is electrically connected to the two test pads through the N-type doped regions. The present application can detect edge cracks caused by wafer manufacturing, die sawing, and chip packaging processes to reduce reliability risk.

5 Claims, 3 Drawing Sheets

DETECTION STRUCTURE FOR CHIP EDGE CRACKS AND DETECTION METHOD THEREOF

REFERENCE TO RELATED APPLICATION

The present application claims priority to Chinese Application number CN2021115098089, filed on Dec. 10, 2021, the contents of which are incorporated herein by reference.

TECHNICAL FIELD

The present application generally relates to the field of semiconductor technology, and more specifically relates to a detection structure for chip edge cracks and a detection method thereof.

BACKGROUND

Wafer manufacturing, die sawing, chip packaging and other processes may cause cracks at the edge of the chip, and moisture and gas pollution at the cracks may bring reliability risk to the product. There is no real-time crack detection scheme for now, but depends on reliability test.

Therefore, there is a need to provide a detection structure for chip edge cracks and a detection method thereof.

SUMMARY OF THE INVENTION

An object of the present application is to provide a detection structure for chip edge cracks and a detection method thereof, which can detect the edge cracks caused by the wafer manufacturing, die sawing, and chip packaging processes to reduce reliability risk.

The present application discloses a detection structure for chip edge cracks, which comprises: a test ring located between a chip scribe line and a sealing ring, wherein the chip comprises two test pads for detecting continuity of the test ring, the sealing ring comprises a P-type doped ring located in a substrate and a shallow trench isolation area for isolating the sealing ring from the test ring, the shallow trench isolation area is formed with N-type doped regions electrically connected to the two test pads respectively; the test ring comprises a multi-layer interconnection structure located on the substrate and the interconnection structure is electrically connected to the two test pads through the N-type doped regions.

In one embodiment, the two test pads are two dedicated continuity test pads.

In one embodiment, the two test pads are multiplexed internal pads of the chip, and a test switch is connected between the N-type doped region and the test pad.

In one embodiment, the test ring is located in a dummy space between the scribe line and the sealing ring.

In one embodiment, the test ring comprises 5~8 layer interconnection structure, wherein a metal layer per 5 um length of the interconnection structure is connected by 3 vias, and a total resistance value of the multi-layer interconnection structure is 20K Ω~30K Ω.

In one embodiment, the sealing ring comprises multi-layer interconnection structure located on the P-type doped ring.

The present application also discloses a detection method for chip edge cracks, the detection method is applied to a detection structure for chip edge cracks which comprises: a test ring located between a chip scribe line and a sealing ring, wherein the chip comprises two test pads for detecting continuity of the test ring, the sealing ring comprises a P-type doped ring located in a substrate and a shallow trench isolation area for isolating the sealing ring from the test ring, the shallow trench isolation area is formed with N-type doped regions electrically connected to the two test pads respectively; the test ring comprises a multi-layer interconnection structure located on the substrate and the interconnection structure is electrically connected to the two test pads through the N-type doped regions;

wherein the method includes the following steps:

applying a first predetermined current to one of the two test pads after the chip has passed chip test, and measuring a first voltage value between the two test pads;

comparing the measured first voltage value with a first threshold voltage, and determining that the chip is intact if the measured first voltage value is smaller than the first threshold voltage, and that the chip is failed if the measured first voltage value is greater than or equal to the first threshold voltage;

applying a second predetermined current to one of the two test pads after the chip has passed final test, and measuring a second voltage value between the two test pads; and comparing the measured second voltage value with a second threshold voltage, and determining that the chip is intact if the measured second voltage value is smaller than the second threshold voltage, and that the chip is failed if the measured second voltage value is greater than or equal to the second threshold voltage.

In one embodiment, if the two test pads are multiplexed internal pads of the chip, turning on test switches between the N-type doped regions and the test pads before applied current to the test pad, and turning off the test switches between the N-type doped regions and the test pads after measured the voltage value between the test pads.

In one embodiment, the magnitude of the first predetermined current is 1 nA~100 nA, and the magnitude of the first threshold voltage is less than 0.01 V.

In one embodiment, the magnitude of the second predetermined current is 1 nA~100 nA, and the magnitude of the second threshold voltage is less than 0.01V.

In this application embodiment, the test ring is formed in the dummy space between the scribe line and the sealing ring, and we can determine whether there are chip edge cracks by detecting the continuity of the test ring. The test structure of the present application is simple and the test cost is low.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute Various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already recorded because of the technical infeasibility, and A+B+C+E scheme should be considered as already documented.

DETAILED DESCRIPTION

In the following description, numerous technical details are set forth in order to provide the readers with a better understanding of the present application. However, those skilled in the art can understand that the technical solutions claimed in the present application can be implemented without these technical details and various changes and modifications based on the following embodiments.

Several different embodiments are given below according to different features of the present application. The particular components and arrangements in this application are for simplicity, but the application is not limited by these embodiments. For example, the description of forming a first element on a second element may include embodiments in which the first element is in direct contact with the second element, as well as embodiments in which additional elements are formed between the first element and the second element such that the first element and the second element are indirectly contact. In addition, for the sake of simplicity, the present application is represented by repeated component symbols and/or letters in different embodiments, but does not mean that there is a specific relationship between the embodiments and/or structures. It is important to understand that when a layer is "on" another layer or substrate, it may mean that it is directly on the other layer or substrate, or that other layer is sandwiched between other layers or substrates.

In order to make the objects, technical solutions and advantages of the present application more clear, embodiments of the present application will be further described in detail below with reference to the accompanying drawings.

Figures 1, 2:
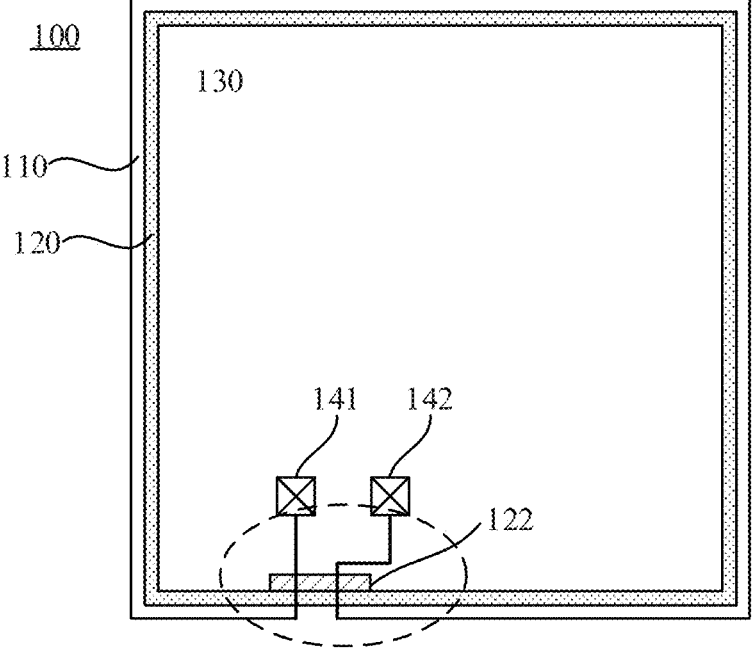
FIG. 1 shows a top view schematic diagram of a detection structure in an embodiment of this application.
FIG. 2 shows a schematic diagram of die sawing in an embodiment of this application.

The present application discloses a detection structure for chip edge cracks. FIG. 1 shows a top view schematic diagram of a detection structure 100 in an embodiment of this application. The detection structure 100 comprises a test ring 110 located between a chip scribe line (shown in FIG. 2) and a sealing ring 120, wherein the chip 130 is surrounded by the sealing ring 120. The chip 130 comprises two test pads 141 and 142 for testing continuity of the test ring 110. The term "continuity" described in this application refers to the continuity and integrity of current loop of the test ring.

In one embodiment, the test ring 110 is located in the dummy space (or dummy bar) between the scribe line and the sealing ring 120. More specifically, referring to FIG. 2, the entire wafer is divided into multiple chips or dies after the wafer manufacturing is completed. There are sealing rings around each chip, and the width of the sealing ring is usually arranged to 10 microns to 20 microns, such as 15 microns. The chip scribe line is between adjacent dies. The width of the scribe line is usually arranged to 10 microns to 100 microns, for example, 20 microns, 40 microns, 60 microns, and 80 microns. Typically, there is also dummy space between the sealing ring and the scribe line. The dummy space is only used as a physical existence on the wafer without practical functions. In this embodiment, the test ring 110 is arranged in the dummy space, which will not affect the function of the chip.

In one embodiment, the two test pads 141 and 142 are two dedicated continuity test pads. The two test pads 141 and 142 are only used to test for chip edge cracks.

Figure 3:
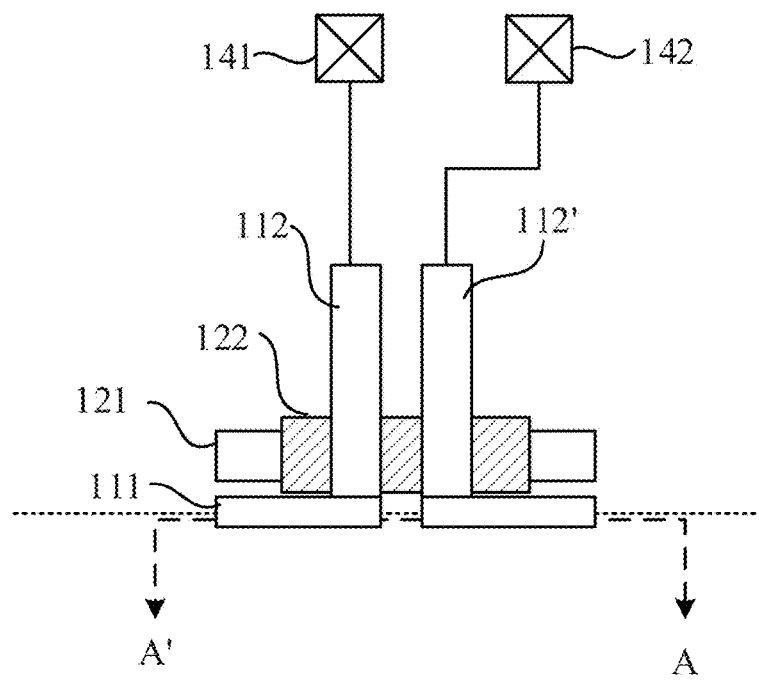
FIG. 3 shows a schematic diagram of local area in FIG. 1 in an embodiment of this application.

FIG. 3 shows enlarged schematic diagram of the dotted circle area in FIG. 1. The sealing ring 120 comprises a P-type doped ring 121 located in the substrate (not shown in the figure) and a shallow trench isolation area (referred to STI) 122 used to isolate the sealing ring 120 from the test ring 110. The shallow trench isolation area 122 is formed with two N-type doped regions 112 and 112' connected to the two test pads 141 and 142 respectively. The N-type doped regions 112 and 112' are surrounded by the shallow trench isolation area 122 to insulate the N-type doped regions 112 and 112' from the P-type doped ring 121 without affecting the integrity of the sealing ring 120 above it. The test ring 110 comprises a multi-layer interconnection structure 111 located on the substrate, and the interconnection structure 111 is electrically connected to the test pads 141 and 142 through the N-type doped regions 112 and 112'.

Figure 4:
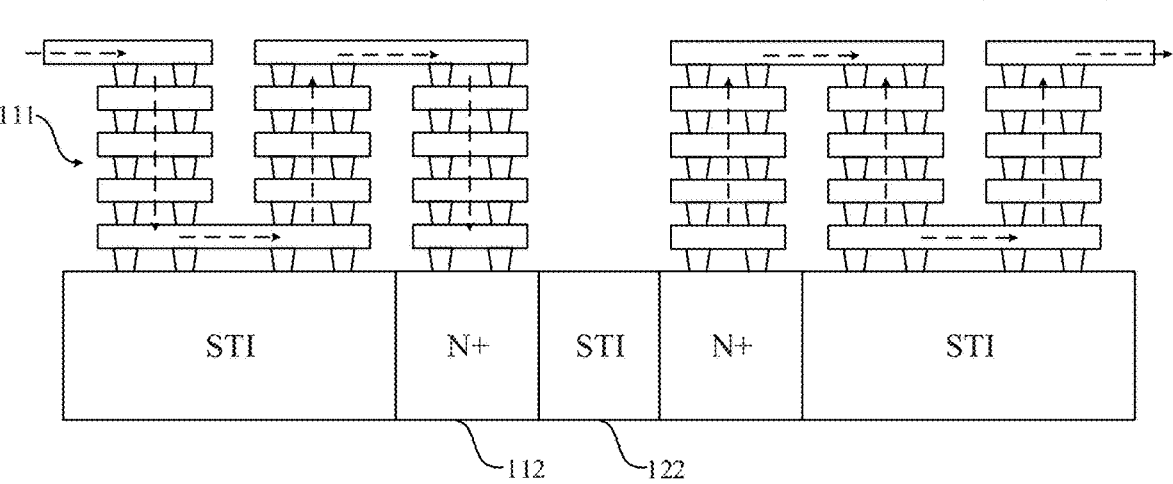
FIG. 4 shows a schematic cross-sectional diagram of local area in FIG. 3 in an embodiment of this application.

In one embodiment, the test ring comprises 5 to 8 layer interconnection structure, for example, 5-layer interconnection structure is adopted. The term "interconnection structure" refers to metal layers and vias connecting the metal layers formed on the surface of the semiconductor substrate during the wafer manufacturing process, which is used to connect source and drain in the semiconductor substrate to external circuit. FIG. 4 shows schematic cross-sectional diagram of FIG. 3 along AA'. It can be seen from FIG. 4 that the interconnection structure 111 is connected to the N-type doped regions (N+) 112 and 112', so that it can be electrically connected to the test pads 141 and 142, allowing the test ring 110 to form a complete current loop. In this embodiment, the chip edge cracks can be detected according to the continuity of the test ring. When the continuity of the test ring is damaged, it can be considered to be caused by the chip edge cracks.

In one embodiment, the sealing ring 120 comprises a multi-layer interconnection structure on the P-type doped ring (not shown in the figure), It should be noted that the number of layers of the metal layer in the sealing ring can be the same as the number of layers of the metal layer in the test ring, and the multi-layer interconnection structures of the sealing ring can be formed in the same process step as the multi-layer interconnection structures of the test ring.

For example, for a chip with an area of 10 mm×10 mm, an 8-layer metal layer is used for interconnection. The resistance value of each through-via is about 10Ω, and the resistance value of the metal layer is two to three orders lower than the resistance value of the through-via. In one embodiment, the metal layer per Sum length of the interconnection structure is connected by 3 vias, and a total resistance value of the multi-layer interconnection structure is 201KΩ~30KΩ, while the measured voltage value is about 0.0027V.

Figure 5:
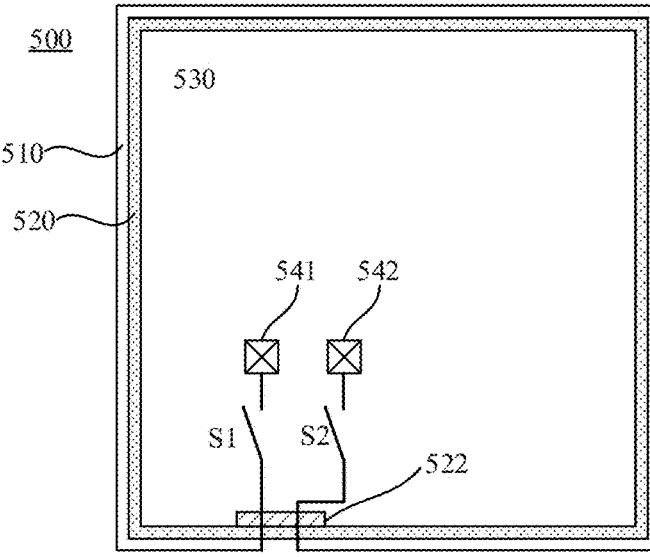
FIG. 5 shows a top view schematic diagram of a detection structure in another embodiment of this application.

FIG. 5 shows a top view schematic diagram of a detection structure 500 in another embodiment of this application. The detection structure 500 comprises a test ring 510 located between the chip scribe line (not shown in the figure) and the sealing ring 520, wherein the chip 530 is surrounded by the sealing ring 520. The chip 530 internally comprises two test pads 541 and 542 for testing continuity of the test ring 510. Wherein, the test ring 510 and the sealing ring 520 are identical in structure to the test ring 110 and the sealing ring 120 respectively in FIG. 1. For example, the sealing ring 520 comprises a shallow trench isolation area 522 used to separate the sealing ring 520 and the test ring 510, which will not be described herein. In this embodiment, the two test pads 541 and 542 are multiplexed internal pads of the chip 530. The test pads 541 and 542 are connected to the test ring by test switches S1 and S2 respectively.

Figure 6:
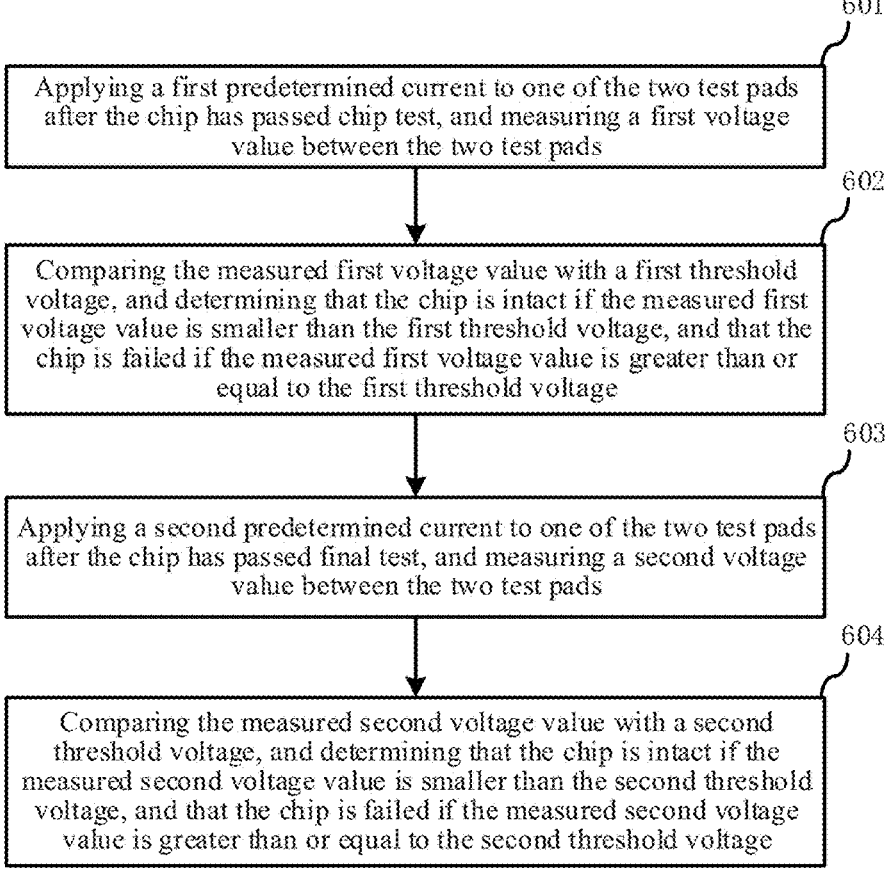
FIG. 6 shows a flowchart for a detection method in an embodiment of this application.

Another embodiment of this application also discloses a detection method for chip edge cracks. Referring to FIG. 1 and FIG. 6, the method comprises the following steps:

Step 601, applying a first predetermined current to one of the two test pads after the chip has passed chip test (CP test), and measuring a first voltage value between the two test pads. In one embodiment, the magnitude of the first predetermined current is 1 nA~100 nA.

Step 602, comparing the measured first voltage value with a first threshold voltage, and determining that the chip is intact if the measured first voltage value is smaller than the first threshold voltage and that the chip is failed if the measured first voltage value is greater than or equal to the first threshold voltage. In one embodiment, the first threshold voltage is less than 0.01 V.

It should be understood that if the measured first voltage value is less than the first threshold voltage, it is indicated that the continuity of the test ring is intact, that is, there is no chip edge crack. If the measured first voltage value is greater than or equal to the first threshold voltage, it is indicated that the continuity of the test ring is damaged, that is, there are chip edge cracks during the wafer manufacturing process.

Step 603, applying a second predetermined current to one of the two test pads after the chip has passed final test (i.e., FT), and measuring a second voltage value between the two test pads. In one embodiment, the magnitude of the second predetermined current is 1 nA~100 nA.

Step 604, comparing the measured second voltage value with a second threshold voltage, and determining that the chip is intact if the measured second voltage value is smaller than the second threshold voltage and that the chip is failed if the measured second voltage value is greater than or equal to the second threshold voltage. In one embodiment, the second threshold voltage is less than 0.01V.

It should be understood that if the measured second voltage value is less than the second threshold voltage, it is indicated that the continuity of the test ring is intact, that is, there is no chip edge crack. If the measured second voltage value is greater than or equal to the second threshold voltage, it is indicated that the continuity of the test ring is damaged, that is, there are chip edge cracks during the die sawing and chip packaging processes.

In this embodiment, the chip edge cracks can be detected according to the continuity of the test ring, and it can be determined that whether the chip edge crack is caused by the wafer manufacturing or the die sawing and chip packaging processes.

In other embodiments of this application, the two test pads may be multiplexing internal pads of the chip to save the number of internal pads of the chip. Before applied current to the test pad, turning on the test switches between the N-type doped regions and the test pads, and after measured the voltage value between the test pads, turning off the test switches.

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a multiple elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

The specification includes combinations of the various embodiments described herein. Separate references to embodiments (such as "an embodiment" or "some embodiments" or "preferred embodiments") do not necessarily refer to the same embodiment; however, these embodiments are not mutually exclusive unless indicated as mutually exclusive or clearly mutually exclusive by those skilled in the art. It should be noted that unless the context clearly indicates or requires otherwise, the word or is used in this specification in a non-exclusive sense.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

What is claimed is:

1. A detection structure for chip edge cracks, comprising: a test ring located between a chip scribe line and a sealing ring, wherein the chip comprises two test pads for detecting continuity of the test ring, the sealing ring comprises a P-type doped ring located in a substrate and a shallow trench isolation area for isolating the sealing ring from the test ring, the shallow trench isolation area is formed with N-type doped regions electrically connected to the two test pads respectively, the N-type doped regions are surrounded by the shallow trench isolation area to insulate the N-type doped regions from the P-type doped ring; the test ring comprises a multi-layer interconnection structure located on the substrate and the interconnection structure is electrically connected to the two test pads through the N-type doped regions.

2. The detection structure for chip edge cracks according to claim 1, wherein the two test pads are multiplexed internal pads of the chip, and a test switch is connected between the N-type doped region and the test pad.

3. The detection structure for chip edge cracks according to claim 1, wherein the test ring is located in a dummy space between the scribe line and the sealing ring.

4. The detection structure for chip edge cracks according to claim 1, wherein the test ring comprises 5~8 layer interconnection structure, wherein a metal layer per 5 um length of the interconnection structure is connected by 3 vias, and a total resistance value of the multi-layer interconnection structure is 20KΩ~30KΩ.

5. The detection structure for chip edge cracks according to claim 1, wherein the sealing ring comprises multi-layer interconnection structure located on the P-type doped ring.

* * * * *